(12) United States Patent
Chang et al.

(10) Patent No.: US 9,773,696 B2
(45) Date of Patent: Sep. 26, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Che-Cheng Chang, New Taipei (TW); Chang-Yin Chen, Taipei (TW); Jr-Jung Lin, Hsinchu (TW); Chih-Han Lin, Hsinchu (TW); Yung Jung Chang, Hsinchu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 82 days.

(21) Appl. No.: 14/163,302

(22) Filed: Jan. 24, 2014

(65) Prior Publication Data

US 2015/0214367 A1   Jul. 30, 2015

(51) Int. Cl.
| | |
|---|---|
| H01L 21/768 | (2006.01) |
| H01L 21/8234 | (2006.01) |
| H01L 21/84 | (2006.01) |
| H01L 27/088 | (2006.01) |
| H01L 27/12 | (2006.01) |
| H01L 21/311 | (2006.01) |
| H01L 29/66 | (2006.01) |

(52) U.S. Cl.
CPC .. *H01L 21/76802* (2013.01); *H01L 21/76834* (2013.01); *H01L 21/76897* (2013.01); *H01L 21/823431* (2013.01); *H01L 21/845* (2013.01); *H01L 27/0886* (2013.01); *H01L 27/1211* (2013.01); *H01L 21/31144* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2010/0270627 A1* | 10/2010 | Chang | H01L 21/28247 257/411 |
| 2012/0032238 A1* | 2/2012 | Teo | H01L 21/28518 257/288 |
| 2013/0288471 A1 | 10/2013 | Chi et al. | |

* cited by examiner

*Primary Examiner* — Jack Chen
(74) *Attorney, Agent, or Firm* — WPAT, P.C., Intellectual Property Attorneys; Anthony King

(57) ABSTRACT

The present disclosure provides a semiconductor structure having a semiconductor layer; a gate with a conductive portion and a sidewall spacer; an interlayer dielectric (ILD) surrounding the sidewall spacer; and a nitrogen-containing protection layer, positioning at least on the top surface of the conductive portion of the gate. A top surface of the conductive portion and a top surface of the sidewall spacer are substantially coplanar. The nitrogen-containing protection layer is not covering the sidewall surface of the sidewall spacer. The present disclosure provides a method for manufacturing a semiconductor structure. The method includes forming a metal gate structure having a conductive portion and a sidewall spacer surrounded by a first ILD; forming a protection layer over the metal gate structure, and the protection layer is formed to cover at least the conductive portion of the metal gate structure; and forming a second ILD over the metal gate structure.

5 Claims, 20 Drawing Sheets

SEMICONDUCTOR STRUCTURE AND MANUFACTURING METHOD THEREOF

FIELD

The disclosure relates to a gate in a semiconductor structure.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each NFET and PFET formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
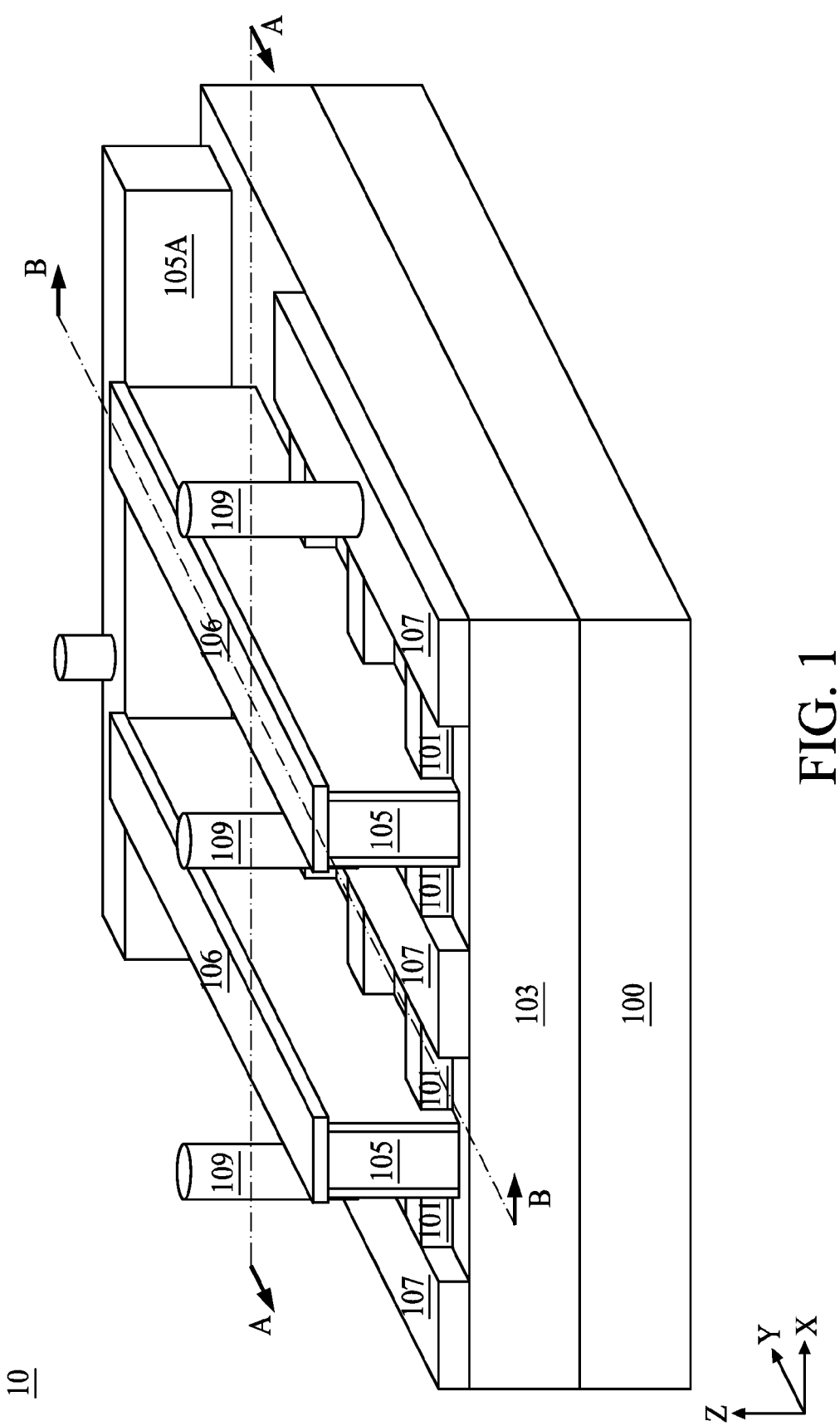
FIG. 1 is a perspective view of a semiconductor structure with metal gates in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Along with the semiconductor device scaling rule, the decrease of the gate-to-gate pitch in a MOSFET effectively reduces the distance between a conductive plug (usually a tungsten plug) and the gate. The conductive plug usually situates between two adjacent gates and electrically connecting the heavily doped region to an upper level integrated circuit or an external signal I/O. In a larger scale device where the gate-to-gate pitch, for example, is greater than 500 nm, applying a manual alignment to the patterning of the conductive plug does not generate bridge problems between the contact plug and the gate. However, when the gate-to-gate pitch materially decreases to an extent that a minute overlay shift would induce bridge problem, a new approach shall be sought to resolve this issue.

The bridge problem between the contact plug and the gate due to misalignment not only occur in the scale down of traditional MOSFET. When technology node reduces to 16 nm or even 10 nm, FinFET structure and FET of other geometry or design suffer from the above-mentioned bridge problem as well. For example, in a FinFET structure with a channel length of 16 nm, the gate-to-gate pitch may be in a range of from about 50 nm to about 200 nm, since currently there is no self-aligned operation to control the precision of the conductive plug position relative to the gate position, a minute misalignment may well overlay the conductive plug onto the gate.

One approach to circumvent the bridge problem is to provide a protection structure in the gate structure, isolating the contact plug and the conductive materials constituting the gate. For example, in a FinFET structure having a metal gate, the work function metal and the gate fill metal are formed in the space surrounded by a sidewall spacer. However, in a final product, a top surface of the work function metal and a top surface of the gate fill metal are not coplanar with a top surface of the sidewall spacer. The work function metal and the gate fill metal together form a metal recess in the space surrounded by a sidewall spacer, and the protection structure fills the metal recess, resulting in that a top surface of the protection structure is substantially coplanar with the top surface of the sidewall spacer.

In the above-mentioned protection structure, a width of the protection structure is essentially equal to a width of the work function metal and the gate fill metal deposited in the space surrounded by the sidewall spacer. A thickness of the protection structure is determined to be a distance between a top of the metal recess and the top surface of the sidewall spacer. Because, in some cases, the etch rate of the work function metal and the etch rate of the gate fill metal are different, the metal recess formed in the space surrounded by the sidewall spacer does not possess a substantial level bottom surface, and hence the thickness of the protection structure in the above-mentioned approach is not substantially uniform. In addition, the thickness of the protection structure described in the above-mentioned approach can be within a range of from about 10 Å to about 20 Å.

As described above, the formation of the metal gate with a protection structure at least includes an etch back operation when forming the metal recess, a subsequent overfilling operation when forming the protection structure, and a leveling operation when forming the substantially coplanar top surfaces of the protection layer and the sidewall spacer. A height of the sidewall spacer in the metal gate with a protection structure is substantially greater than that of a metal gate without the protection structure. For example, in a metal gate having a protection structure as described above, the height of the sidewall spacer shall be greater than the height of the work function metal or the gate fill metal because the space surrounded by the sidewall spacer is designed to accommodates the work function metal and the gate fill metal at a lower portion, and the protection structure at an upper portion. In contrast, in a metal gate without a protection structure, a top surface of the sidewall spacer and a top surface of the work function metal or the gate fill metal are substantially coplanar, that is, the height of the sidewall spacer is substantially equal to the height of the work function metal or the gate fill metal.

Some embodiments of the present disclosure provide a semiconductor structure having a gate structure. The gate structure in some embodiments can be a polysilicon gate (hereinafter a "poly-gate") in various scales in the present art and a sidewall spacer surrounding the poly-gate. The gate structure in some embodiments can be a metal gate in various scales in the present art and a sidewall spacer surrounding the metal gate. In some embodiments, a dielectric layer further surrounds an outer sidewall of the sidewall spacer. A protection layer is positioned on the top surface of the gate structure. Compared to the protection structure in the gate structure described above, the protection layer described in the present disclosure is positioned on top of the gate structure instead of being positioned in the space surrounded by the sidewall spacer. The gate structure in the present disclosure has a conductive portion and a sidewall spacer. In a traditional poly-gate structure, the conductive portion is the polysilicon deposited in the sidewall spacer. In a metal gate structure, the conductive portion directs to the work function metal and the gate fill metal formed in the sidewall spacer.

In some embodiments, the protection layer in the present disclosure is formed at least on a top surface of the conductive portion of the gate structure, that is, the width of the protection layer can varies to be either covering only the conductive portion of the gate structure or covering both the conducive portion and the sidewall spacer of the gate structure. In some embodiments, the materials made of the protection layer can be any material that has a substantial different etching rate to the materials made of the dielectric layer. For example, the protection layer is made of nitrogen-containing materials and the dielectric layer is made of oxide-based materials. In some embodiments, a top surface of the conductive portion of the gate structure is substantially coplanar with a top surface of the sidewall spacer.

Some embodiments of the present disclosure provide a semiconductor FinFET structure including several metal gates positioned over a semiconductor fin. A total width of one of the metal gates includes a conductive portion width and a sidewall spacer width because the metal gate structure described herein includes a conductive portion and a sidewall spacer. In some embodiments, a top surface of the conductive portion and a top surface of the sidewall spacer are substantially coplanar. In some embodiments, the metal gate structure in the FinFET further includes a dielectric layer surrounding an outer sidewall of the sidewall spacer, and the dielectric layer is disposed at least over the semiconductor fin. In some embodiments, the dielectric layer can also be disposed on a top surface of the sidewall spacer. In some embodiments, the materials made of the protection layer can be any material that has a substantial different etching rate to the materials made of the dielectric layer. For example, the protection layer is made of nitrogen-containing materials and the dielectric layer is made of oxide-based materials.

Some embodiments of the present disclosure provide a method for manufacturing a semiconductor structure having a metal gate. The method includes operations of forming a metal gate structure with a substantial level top surface. A portion of the substantial level top surface includes a top surface of a work function metal layer, a portion of the substantial level top surface includes a top surface of a gate fill metal layer, and a portion of the substantial level top surface includes a top surface of a sidewall spacer. A first dielectric layer is formed surrounding an outer sidewall of the sidewall spacer. A protection layer is formed over the metal gate structure, covering at least a conductive portion, that is, the portion without the sidewall spacer, of the metal gate structure. A second dielectric layer is formed over the metal gate structure and the protection layer; and forming a conductive plug between two adjacent metal gate structures.

Referring to FIG. 1, a perspective view of a metal gate structure 10 is shown. In FIG. 1, an isolation region 103 is over a substrate 100, and three semiconductor fins 101 are positioned over the isolation region 103. A portion of the semiconductor fin is buried in the isolation region 103 and is not shown in FIG. 1. The substrate 100 may be a bulk silicon substrate. Alternatively, the substrate 100 may includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates also include a silicon-on-insulator (SOI) substrate. SOI substrates are fabricated using separation by implantation of oxygen (SIMOX), wafer bonding, and/or other suitable methods.

In some embodiments, the substrate 100 includes an insulator layer (not shown in FIG. 1). The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET structure, the insulator layer is a component (e.g., layer) of a silicon-on-insulator substrate.

The isolation region 103 is formed on the substrate 100 to isolate active regions of the substrate 100. The isolation region 103 utilizes isolation technology, such as shallow trench isolation (STI), to define and electrically isolate the various regions. The isolation region 103 includes silicon oxide, silicon nitride, silicon oxynitride, an air gap, other suitable materials, or combinations thereof. The isolation region 103 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials.

The three semiconductor fins 101 positioned on the isolation layer 103 are arranged along the X direction whereas three contact regions 107 are arranged along the Y direction. As shown in FIG. 1, the contact region 107 is shown to be a conductive stripe electrically connecting the three semiconductor fins 101 in an orthogonal manner. In some embodiments, the contact region 107 can electrically connect the semiconductor fins 101 in a staggered fashion with various crossing angels.

As shown in FIG. 1, the semiconductor fin 101 is formed on the substrate 100. In some embodiments, the gate structure 10 includes more than one semiconductor fin 101. The semiconductor fin 101 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the silicon layer. Area not protected by the masking element is etched using reactive ion etching (RIE) processes and/or other suitable processes. In an example, the semiconductor fin 101 is formed by patterning and etching a portion of the substrate 100. In another example, the semiconductor fin 101 is formed by patterning and etching a semiconductor layer deposited overlying an insulator layer (for example, an upper silicon layer of a silicon-insulator-silicon stack of an SOI substrate).

As an alternative to traditional photolithography, the semiconductor fin 101 can be formed by a double-patterning lithography (DPL) process. DPL is a method of constructing a pattern on a substrate by dividing the pattern into two interleaved patterns. DPL allows enhanced feature (e.g., semiconductor fin) density. Various DPL methodologies include double exposure (e.g., using two mask sets), forming spacers adjacent features and removing the features to provide a pattern of spacers, resist freezing, and/or other suitable processes. It is understood that multiple parallel semiconductor fin 101 may be formed in a similar manner.

Suitable materials for forming the semiconductor fin 101 include silicon and silicon germanium. In some embodiments, the semiconductor fin 101 may also include various doped regions. For example, various doped regions can comprise lightly doped source/drain (LDD) regions and source/drain (S/D) regions (also referred to as heavily doped S/D regions). An implantation process (i.e., a junction implant) is performed to form S/D regions. The implantation process utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes include rapid thermal annealing (RTA) and/or laser annealing processes.

Referring to FIG. 1, several metal gates 105 are formed over the semiconductor fins 101. In some embodiments, the metal gates 105 is orthogonally arranged to cross several semiconductor fins 101 and electrically connected to a metal gate contact 105A disposed on the isolation region 103 along the X direction. Several conductive plugs 109 are formed on the contact region 107, functioning as a contact of the active region (for example, source and drain) of the semiconductor fin 101. For clarity purpose, a dielectric layer partially or fully covering the metal gates 105, the semiconductor fins 101, and the contact plugs 109 are not shown in FIG. 1 in order to show the buried structures. However, the dielectric layer described above is shown in FIG. 3 of the present disclosure, demonstrating a cross sectional view of the metal gate structure 10 dissecting along line AA.

In some embodiments, one or more metal gates 105 are formed over the isolation region 103, including over a portion of the semiconductor fins 101. In some embodiments, the metal gate 105 has an interfacial layer, a gate dielectric layer, a work function metal layer, a gate fill metal layer, and a protective layer. It is understood that the metal gate 105 may have additional layers such as interfacial layers, capping layers, diffusion/barrier layers, dielectric layers, conductive layers, other suitable layers, and/or combinations thereof. An exemplary interfacial layer includes silicon oxide (e.g., thermal oxide or chemical oxide) and/or silicon oxynitride (SiON). Among all the workable layers in a metal gate 105, the gate dielectric layer, the work function metal layer, the gate fill metal layer, and the protection layer are further described in details referring to FIG. 3 of the present disclosure.

In some embodiments, the conductive plug 109 is a multilayer interconnection includes vertical interconnects, such as conventional vias or contacts. The various interconnection features may implement various conductive materials including copper, tungsten, and/or silicide. As shown in FIG. 1, the contact plug 109 can have different diameters in different layers of the integrated circuit. In one example, a damascene and/or dual damascene process is used to form a copper related multilayer interconnection structure.

However, the FinFET structure described in FIG. 1 does not limit the scope of the present disclosure. A MOSFET structure can have a gate substantially similar to the gate structure described herein. In a MOSFET, the substrate may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate, in a P-well structure, in an N-well structure, in a dual-well structure, or using a raised structure. The semiconductor substrate may further include various active regions, such as regions configured for an NMOS and regions configured for a PMOS.

Figure 2:
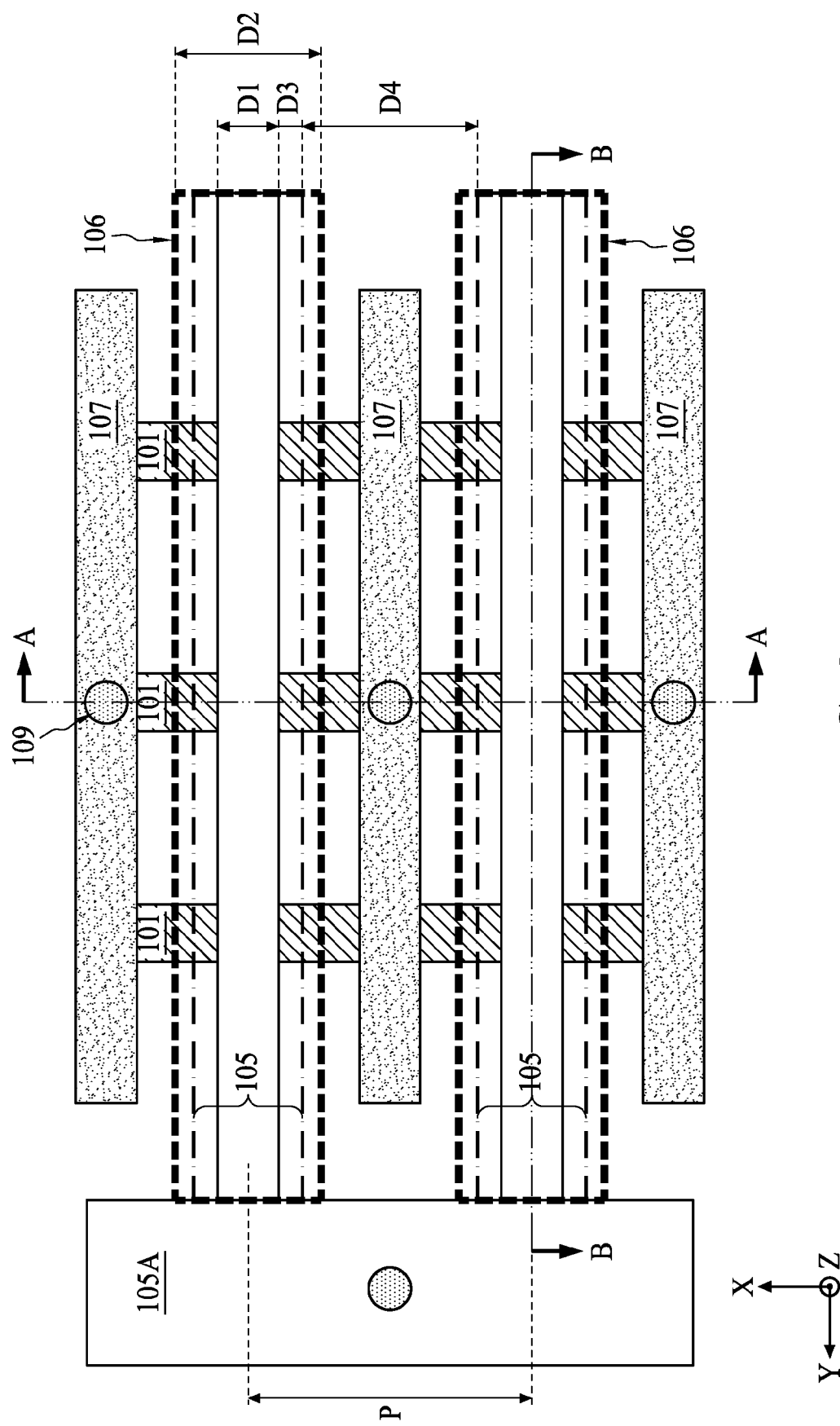
FIG. 2 is a top view of a semiconductor structure with metal gates in accordance with some embodiments of the present disclosure.

FIG. 2 shows a top view in accordance to the metal gate structure 10 shown in FIG. 1. In FIG. 2, three semiconductor fins 101 are arranged along the X direction, two metal gates 105 are positioned on the semiconductor fins 101 and along the Y direction. In some embodiments, a gate contact 105A may be positioned at one end of the metal gates 105, electrically connecting different metal gates 105. In some embodiments, the separation between two metal gates 105 is noted as a gate-to-gate pitch P. Three stripe-shaped contact regions 107 are disposed in a direction parallel to the metal gates 105, electrically connecting the three semiconductor fins 101. In some embodiments, each contact region 107 is disposed between two adjacent metal gates 105. At least a conductive plug 109 is formed on the conductive region 107. If the gate-to-gate pitch P is below 80 nm or 60 nm, the alignment of the conductive plug 109 is critical. Once misaligned, the conductive plug 109 may overlap with the adjacent metal gate 105.

In FIG. 2, the metal gate 105 includes a conductive portion width D1 and a sidewall spacer width D3. From a top view perspective, the sidewall spacer width D3 can be found at two sides of the conductive portion width D1. In some embodiments, a protection layer 106 having a protection layer width D2 greater than the sum of one conductive portion width D1 and two times the sidewall spacer width D3 as shown in FIG. 2. However, in other embodiments, the protection layer width D2 is greater than the conductive portion width D1 but the less than the sum of one conductive portion width D1 and two times the sidewall spacer width D3 (not shown in FIG. 2). In FIG. 2, a separation between the closest sidewall spacer on the two adjacent metal gates 105 is a metal gate space width D4. The metal gate space width D4 decreases when the gate-to-gate pitch P decreases, and hence the misalignment of the conductive plug 109 is more likely to overly on the sidewall spacer as well as the conductive portion of the metal gate 105.

Figure 3:
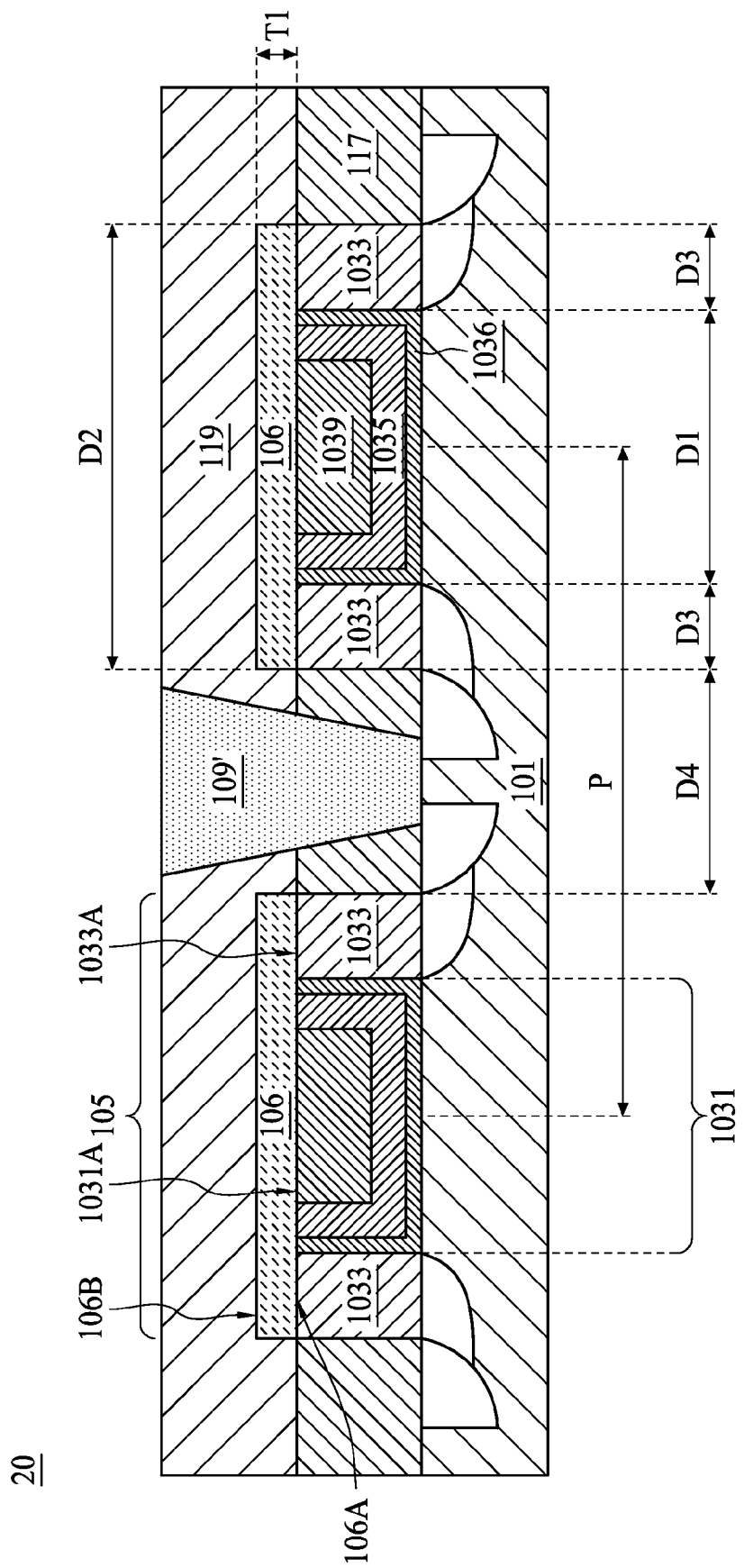
FIG. 3 is a cross sectional view dissecting along line AA of FIG. 1 of a semiconductor structure with metal gates in accordance with some embodiments of the present disclosure.

FIG. 3 is a cross sectional view of a semiconductor structure 20. In some embodiments, FIG. 3 shows the metal gate structure 10 dissecting along line AA of FIG. 1. The semiconductor structure 20 includes a semiconductor layer 101, two gates 105, interlayer dielectrics (ILD) (117, 119), a nitrogen-containing protection layer 106, and a conductive plug 109 disposed between the two gates 105. The gate 105 shown in FIG. 3 includes a conductive portion 1031 and a sidewall spacer 1033 surrounding the conductive portion 1031. In some embodiments, the top surface 1031A of the conductive portion and the top surface 1033A of the sidewall spacer are substantially coplanar. The gates 105 are positioned on a semiconductor layer 101. In some embodiments, the semiconductor layer 101 can be a planar structure in a traditional CMOS or a non-planar structure such as a semiconductor fin in a FinFET.

In FIG. 3, the ILD 117 surrounds an outer surface of the conductive portion 1031, and the ILD 119 insulates the protection layer 106 and other features above the protection layer 106. In some embodiments, the ILD 117 and ILD 119 are not distinguishable from the cross section due to similar forming condition. However, in some embodiments, the ILD 117 and ILD 119 can be distinguished by a border line or different shades shown in electro microscope picture because of varying material density resulted from different growth conditions. As shown in FIG. 3, the nitrogen-containing protection layer 106 covers the top surface 1031A of the conductive portion 1031 and the top surface 1033A of the sidewall spacer 1033. However, the coverage of the nitrogen-containing protection layer 106 does not have to be on the range shown in the present embodiments, various coverage are within the contemplated scope of the present disclosure. In some embodiments, the nitrogen-containing protection layer 106 is not in contact with the sidewall surface of the sidewall spacer 1033.

In some embodiments, the gate 105 shown in FIG. 3 is a metal gate. Among all the workable layers in a metal gate 105, the gate dielectric layer 1036, the work function metal layer 1035, the gate fill metal layer 1039, and the protection layer 106 are further described in details. In some embodiments, the gate dielectric layer 1036 is formed over an interfacial layer (not shown) by any suitable process. The gate dielectric layer 1036 comprises a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HMO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The work function metal layer 1035 is formed over the gate dielectric layer 1036 by any suitable process. The work function metal layer includes any suitable material, such as polysilicon, titanium, tantulum, tantalum nitride, nickel silicide, cobalt silicide, TiN, TiAl, TiAlN, TaCN, TaC, TaSiN, metal alloys, other suitable materials, and/or combinations thereof.

The gate fill metal layer 1039 is formed over the work function metal layer 1035 by any suitable process. The gate fill metal layer 1039 includes any suitable material, such as aluminum, copper, tungsten, molybdenum, WN, other suitable materials, and/or combinations thereof.

The protective layer 106 is formed over the work function metal layer 1035 and the gate fill metal layer 1039 by any suitable process. The protective layer 106 includes any suitable material, for example, silicon nitride, sulfur nitride, SiN, SiON, SiC, SiOC, SiCN, a low-k film, and/or other suitable material. In some embodiments, when subjecting to a predetermined etchant, the protective layer 106 has an etch rate different from the etch rate of the ILDs (117, 119).

Referring to FIG. 2 and FIG. 3, the conductive portion width D1 is total width of the gate fill metal layer 1039, two times of the width of the work function metal layer 1035, and two times of the width of the gate dielectric layer 1036. The sidewall spacer width D3 is the width of a sidewall spacer 1033 positioned at one side of the conductive portion 1031. The protection layer width D2 is the width of the protection layer 106 positioned on a top surface 1031A of the conductive portion 1031 and a top surface 1033A of the sidewall spacer 1033. The metal gate space width D4 is the separation between the sidewall spacer 1033 of two adjacent metal gates 105.

Figure 4:
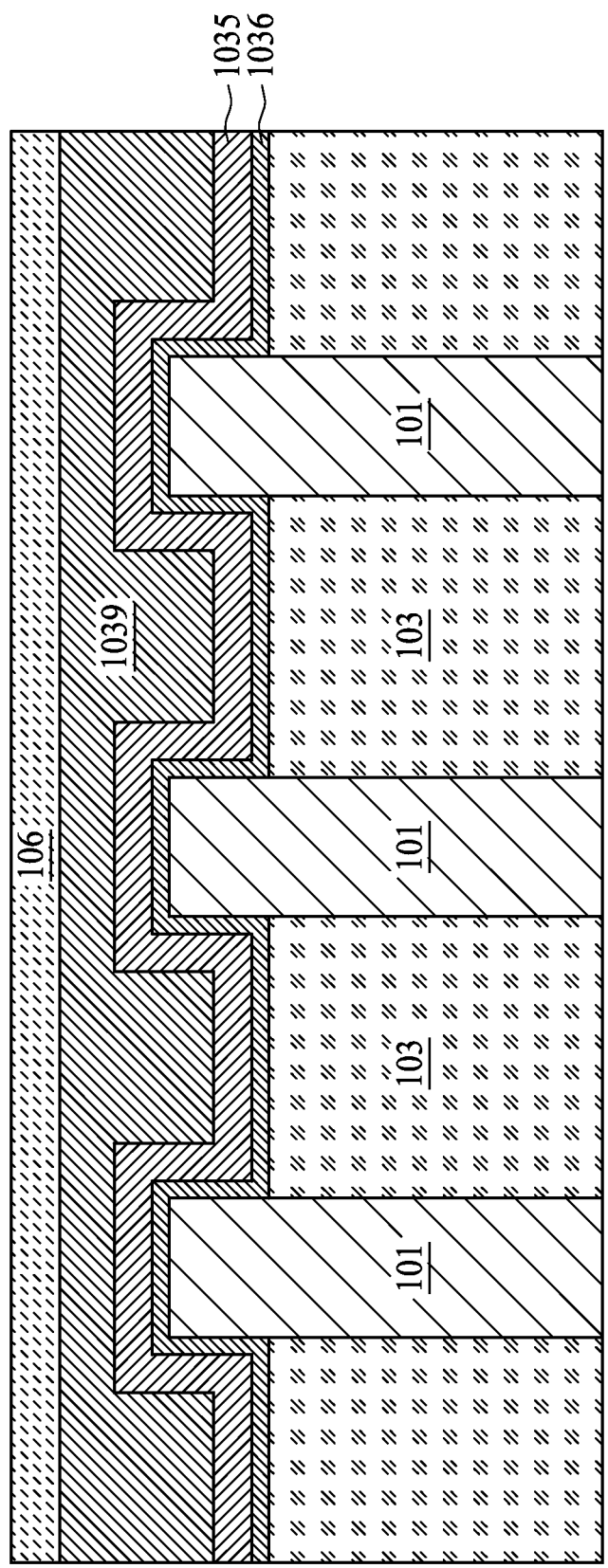
FIG. 4 is a cross sectional view dissecting along line BB of FIG. 1 of a semiconductor structure with metal gates in accordance with some embodiments of the present disclosure.

FIG. 4 is a cross sectional view of a semiconductor structure 30. In some embodiments, FIG. 4 shows the metal gate structure 10 dissecting along line BB of FIG. 1. In FIG. 4, three semiconductor fins 101 are arranged parallel to each other. A portion of the semiconductor fin 101 is buried in the isolation region 103, and a portion of the semiconductor fin 101 protrudes from a top surface of the isolation region 103, constituting the visible portion of the semiconductor fins 101 shown in FIG. 1. A gate dielectric layer 1036 and a work function metal layer 1035 are conformally deposited on the protruding portion of the semiconductor fin 101 and the surface of the isolation region 103. A gate fill metal 1039 layer is formed to fill a gate trench (not shown in FIG. 4), and a protection layer 106 is positioned on top of the gate fill metal 1039.

Figure 5:
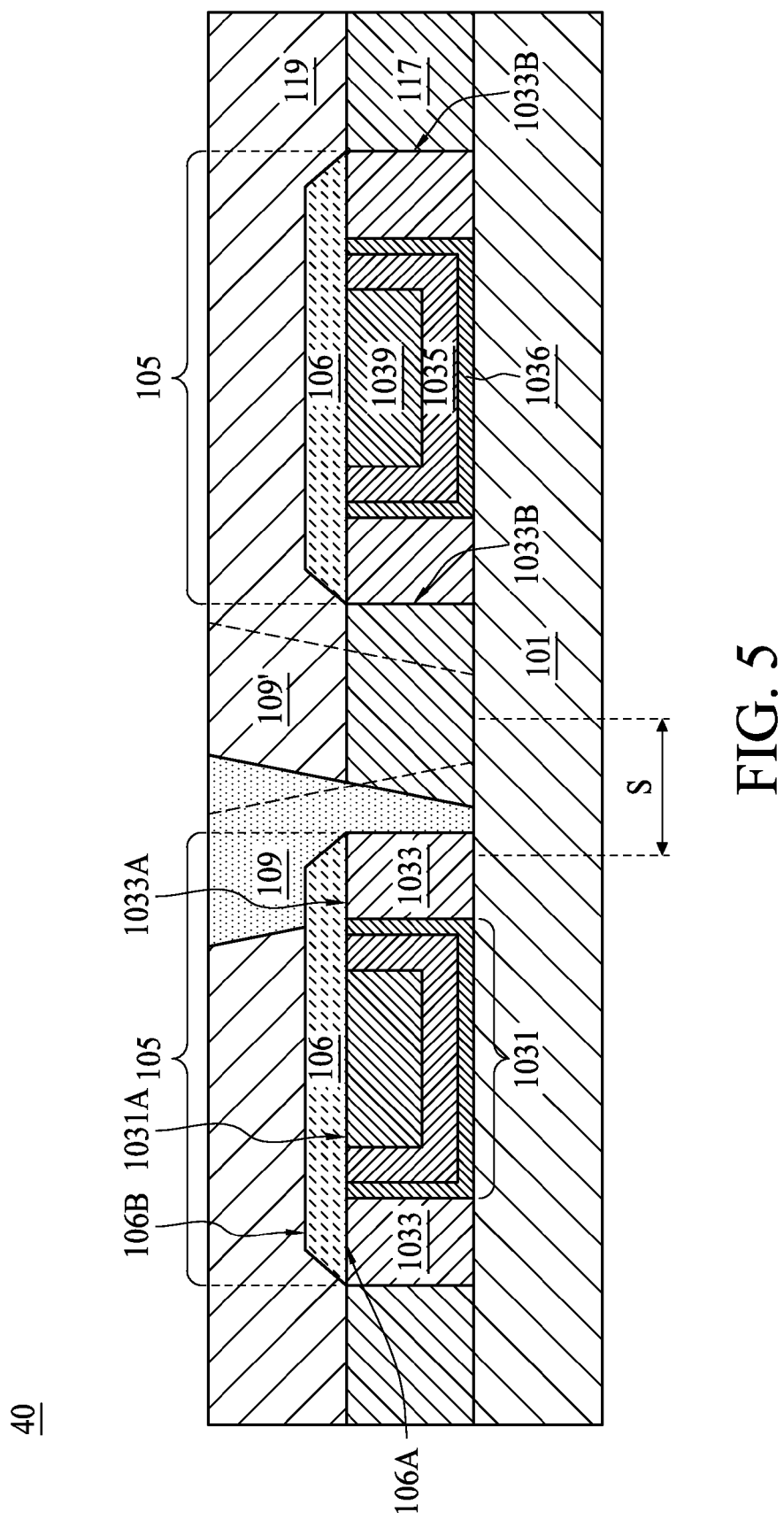
FIG. 5 is a cross sectional view dissecting along line AA of FIG. 1 of a semiconductor structure with metal gates in accordance with some embodiments of the present disclosure.

FIG. 5 shows a cross sectional view of a semiconductor structure 40 according to one embodiments of the present disclosure. The semiconductor structure 40 in FIG. 5 has a semiconductor layer 101 and a gate 105 having a conductive portion 1031 and a sidewall spacer 1033. The top surface 1031A of the conductive portion 1031 and the top surface 1033A of the sidewall spacer 1033 are substantially coplanar. ILD 117 surrounds an outer sidewall surface 1033B of the sidewall spacer 1033, positioning over of the semiconductor layer 101. A nitrogen-containing protection layer 106 is positioned at least on a top surface 1031A of the conductive portion 1031 of the gate 105. In some embodiments, the nitrogen-containing protection layer 106 is not covering the sidewall surface 1033B of the sidewall spacer 1033.

In FIG. 5, the conductive plug 109 is shifted from an ideal position to an overlay position, in other words, if no misalignment occurs, the conducive plug 109' (shown in dotted lines) shall be disposed between the two gates 105 without contacting any portion of the gate 105. However, if the misalignment occurs, for example, the conductive plug 109 (shown in solid lines) left-shifted for a distance S, a portion of the conductive plug 109 is in contact with the protection layer 106 of the gate 105, and another portion of the conductive plug 109 is in contact with the sidewall spacer 1033 of the gate 109. As shown in FIG. 5, although the shifted conductive plug 109 is in contact with the gate 105, the shifted conductive plug 109 is not electrically connected to the conducive portion 1031 of the gate 105, and the shifted conductive plug 109 still provides electrical connection to the source and drain area of the semiconductor structure 40.

In some embodiments as shown in FIG. 5, the protection layer 105 is positioned on the top surface 1031A of the conductive portion 1031 and the top surface 1033A of the sidewall spacer 1033. In FIG. 5, the protection layer 106 has a first surface 106A and a second surface 106B. The first surface 106A is in contact with the top surface of the conductive portion 1031 and that of the sidewall spacer 1033, whereas the second surface 106B is opposite to the first surface 106A, contacting the ILD 119 and partially in conjunction with the shifted conductive plug 109. As shown in FIG. 5, a length of the second surface 106B is shorter than a length of the first surface 106A, and hence the protection layer 106 in FIG. 5 has an oblique sidewall connecting the first surface 106A and the second surface 106B having unequal lengths. The oblique sidewall shown in FIG. 5 is referred to a tapered sidewall in the present disclosure. However, in some embodiments where the first surface 106A and the second surface 106B share an equal length, the sidewall connecting the two is referred to a vertical sidewall.

In FIG. 5, the sidewall spacers 1033, which are positioned on each side of the conductive portion 1031 of the gate 105, may comprise a dielectric material, such as silicon nitride, silicon carbide, silicon oxynitride, other suitable materials, and/or combinations thereof. In some embodiments, the sidewall spacers 1033 are used to offset subsequently formed doped regions, such as source/drain regions. The sidewall spacers 1033 may further be used for designing or modifying the source/drain region (junction) profile. In some embodiments, the protection layer 106 and the sidewall spacer 1033 are made of same materials having a resistance to a predetermined etchant that is different from the resistance of the ILDs (117, 119).

Figure 6:
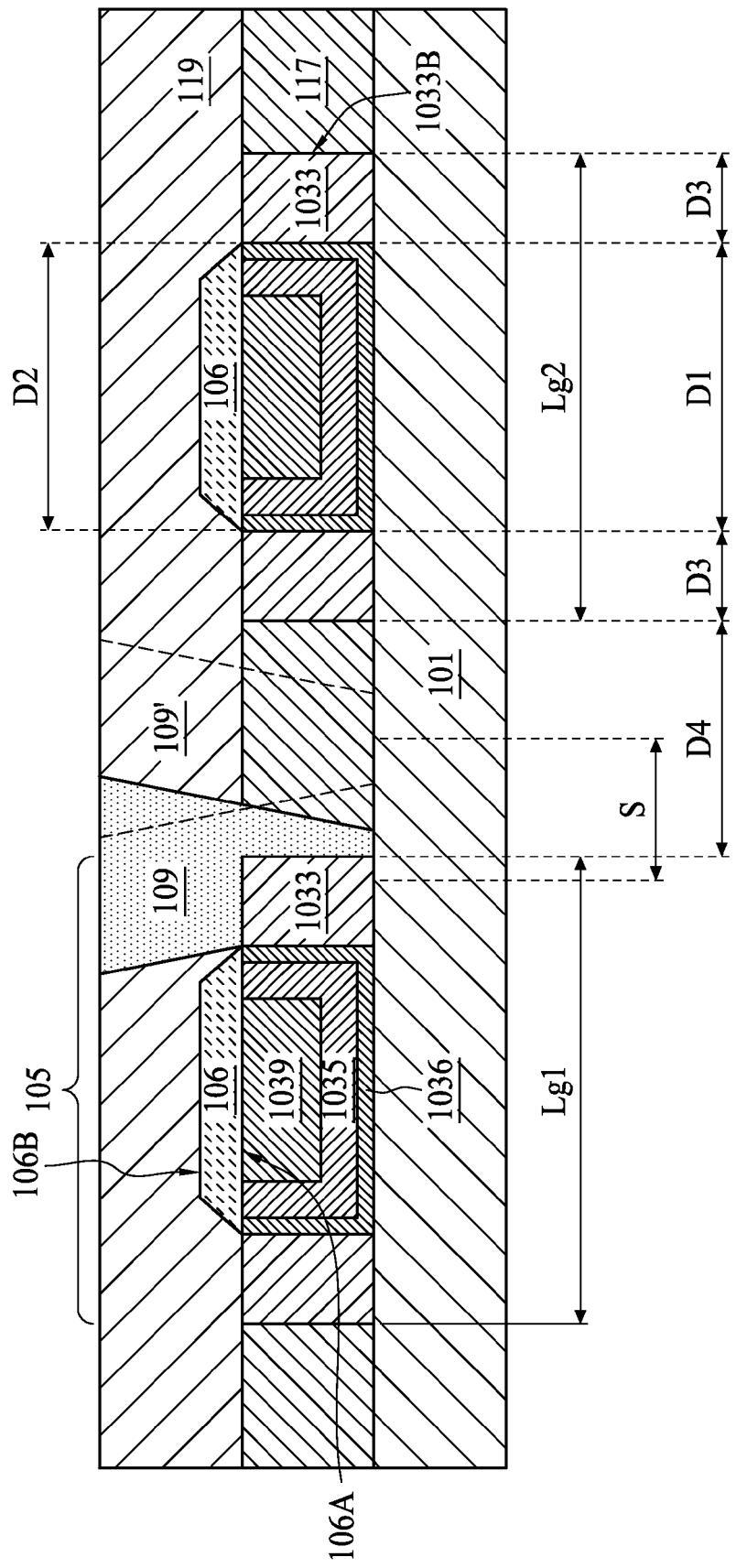
FIG. 6 is a cross sectional view dissecting along line AA of FIG. 1 of a semiconductor structure with metal gates in accordance with some embodiments of the present disclosure.

FIG. 6 shows a cross sectional view of a semiconductor structure 50 according to one embodiment of the present disclosure. The semiconductor structure 50 can be a MOSFET structure or a FinFET structure. In some embodiments, the semiconductor structure 50 is a FinFET structure with a metal gate. Elements with the same numeral labels in FIG. 6 and FIG. 5 are directed to the same structure or materials, and are not repeated here for simplicity. The FinFET structure includes a semiconductor fin 101, and several metal gates 105 positioned over the semiconductor fin 101. An ILD 117 surrounds the metal gates 105, positioning over the semiconductor fin 101. A nitrogen-containing protection layer 106 is disposed over a top surface of the metal gate 105. In some embodiments, the top surface of the metal gate 105 refers to a top surface 1031A of the conductive portion 1031 and a top surface 1033A of the sidewall spacer 1033 of the metal gates 105. As shown in FIG. 6, the top surface 1031A and the top surface 1033A are substantially coplanar.

In FIG. 6, a total metal gate width D1+2D3 of the metal gate 105 is determined by a conductive portion width D1 and a sidewall spacer width D3. The conductive portion width D1 is the width of the conductive portion 1031 of the metal gate, which includes the gate fill metal layer 1039, the work function metal layer 1035, and the gate dielectric layer 1036. The sidewall spacer width D3 refers to the width of a sidewall spacer 1033 at one side of the conductive portion 1031 of the metal gate 105. As shown in FIG. 6, the protection layer 106 has a first surface 106A and a second surface 106B. In some embodiments, the width D2 of the first surface 106A of the protection layer 106 is at least equal to or greater than the conductive portion width D1 of the total metal gate width D1+2D3. In some embodiments, the width D2 of the first surface 106A and the width of the second surface 106B are different, causing the protection layer 106 to have a tapered sidewall as shown in FIG. 6. In other embodiments, the width D2 of the first surface 106A and the width of the second surface 106B are the same, resulting that the protection layer 106 having a vertical sidewall as shown in FIG. 3.

Referring to FIG. 6, the two metal gates 105 has two different dimensions in terms of the channel length. For example, the metal gate 105 at the left end has a channel length Lg1 greater than the channel length Lg2 possessed by the metal gate 105 at the right end. In some embodiments, the semiconductor structure 50 has a mix of metal gates with different channel lengths. In other words, the conductive portion widths D1 are different in at least two of the metal gates 105. In some embodiments, the protection layer 106 positioned over the metal gates 105 with different channel lengths has a same thickness of from about 5 Å to about 5000 Å.

Figure 7:
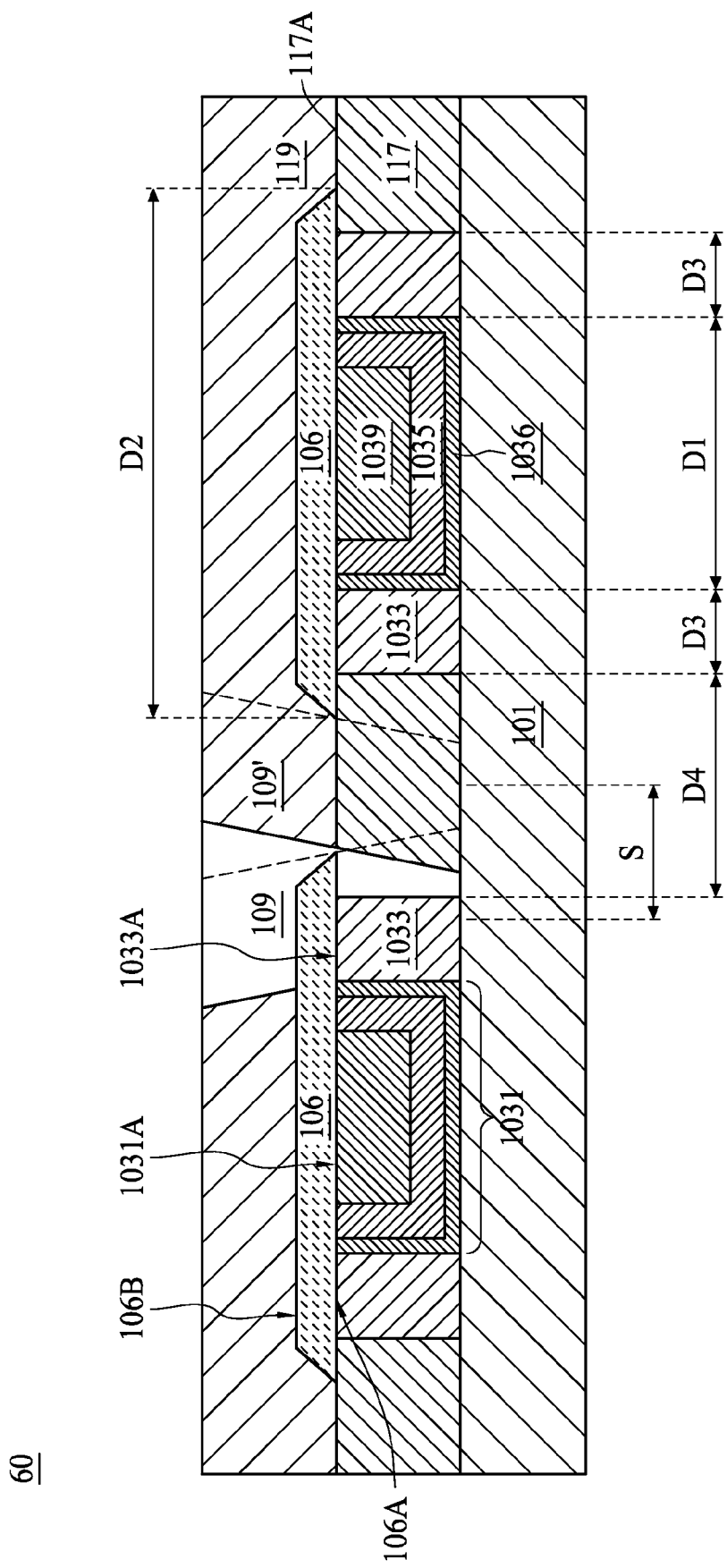
FIG. 7 is a cross sectional view dissecting along line AA of FIG. 1 of a semiconductor structure with metal gates in accordance with some embodiments of the present disclosure.

FIG. 7 shows a cross sectional view of a semiconductor structure 60 according to one embodiment of the present disclosure. The semiconductor structure 60 can be a MOSFET structure or a FinFET structure. Elements with the same numeral labels in FIG. 7 and FIG. 5 are directed to the same structure or materials, and are not repeated here for simplicity. In some embodiments, the semiconductor structure 60 is a MOSFET structure. The protection layer 106 is protruding from the top surface 1031A of the conductive portion 1031 and the top surface 1033A of the sidewall spacer 1033. For example, the conductive portion 1031 in some embodiments is composed of doped polysilicon. The sidewall spacer 1033 in some embodiments is made of dielectric material, such as silicon nitride, silicon carbide, silicon oxynitride, other suitable materials, and/or combinations thereof. Referring to FIG. 7, the protruding portion of the protection layer 106 is supported by the ILD 117. In some embodiments, the ILD 117 supporting the protruding portion of the protection layer 106 has a top surface 117A substantially coplanar with the top surface 1031A of the conductive portion 1031 and the top surface 1033A of the sidewall spacer 1033.

In some embodiments, the semiconductor structure 60 is a FinFET structure. The FinFET structure shown in FIG. 7 possesses metal gates 105 with identical channel lengths and the metal gate space width D4 are substantially similar between two adjacent metal gates 105. In some embodiments, the protection layer width D2 is greater than the conductive portion width D1, but is smaller than a sum of the conductive portion width D1, two times of the sidewall spacer width D3, and a metal gate space width D4. For example, if the protection layer width D2 is to be the sum (D1+2D3+D4) described above, one protection layer 106 over a metal gate 105 is in conjunction to the adjacent protection layer 106, resulting that no space for the conductive plug 109 to entrench trough the ILDs (117, 119). Therefore, the protection layer width D2 shall be smaller than the sum (D1+2D3+D4) described above.

Figure 8:
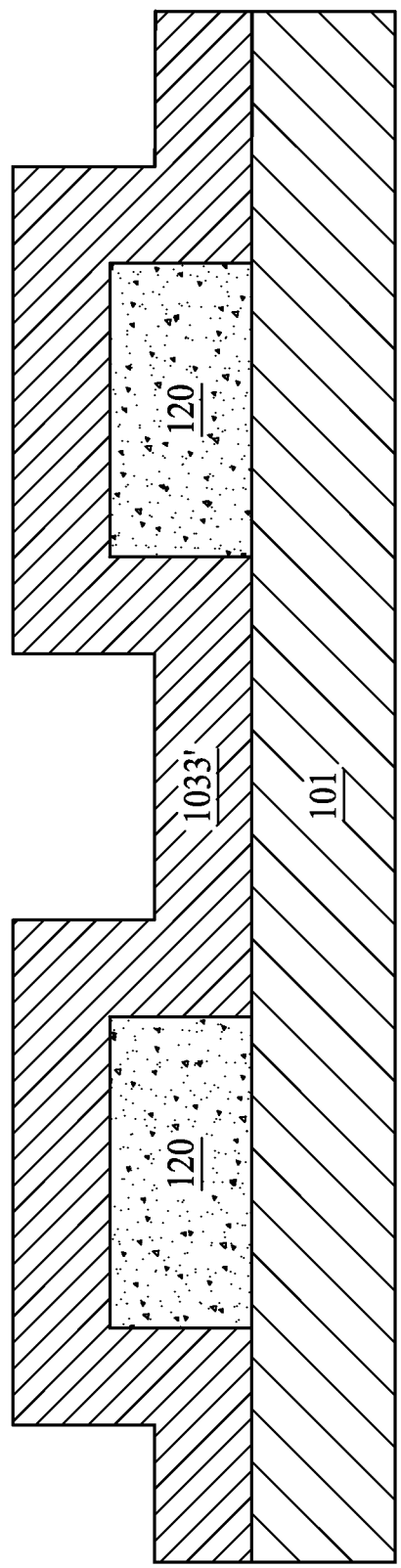
FIG. 8 to FIG. 12 are operations in a semiconductor structure manufacturing method for a metal gate structure with a substantial level top surface in accordance with some embodiments of the present disclosure.

FIG. 8 to FIG. 17B show the operations of a method for manufacturing a semiconductor structure described in the present disclosure. In FIG. 8 to FIG. 12, operations of forming a gate structure with a substantial level top surface 1037 are demonstrated. In some embodiments, the gate structure is a planar polysilicon gate in a MOSFET. In other embodiments, the gate structure is a non-planar metal gate in a FinFET. FIG. 8 to FIG. 12 shows the operations of forming metal gate structure with a substantial level top surface in a FinFET. The cross sections shown in FIG. 8 to FIG. 12 are views from dissecting line AA in FIG. 1. In FIG. 8, a replacement gate 120, or a sacrificial polysilicon gate, is formed over a semiconductor layer 101. In some embodiments, the semiconductor layer 101 refers to a semiconductor fin. A sidewall spacer layer 1033' is conformally formed over the pattern of the replacement gate 120.

Figure 9:
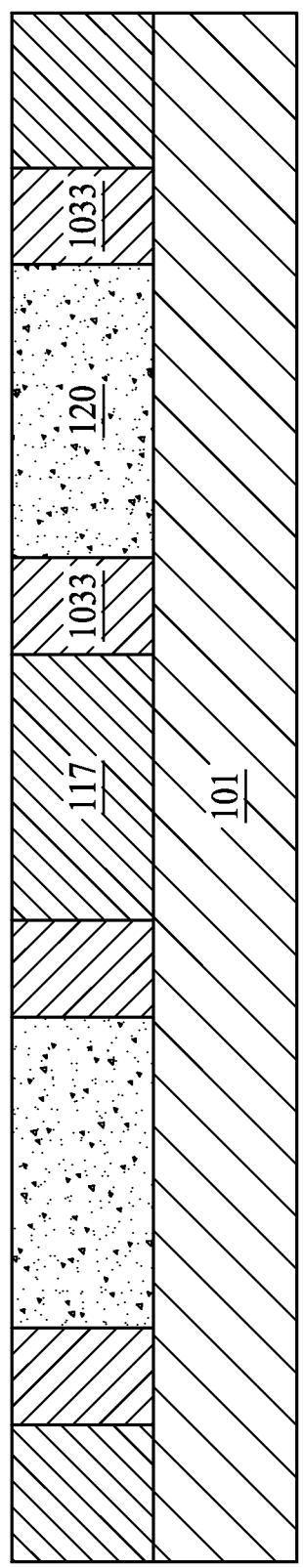
Figure 10:
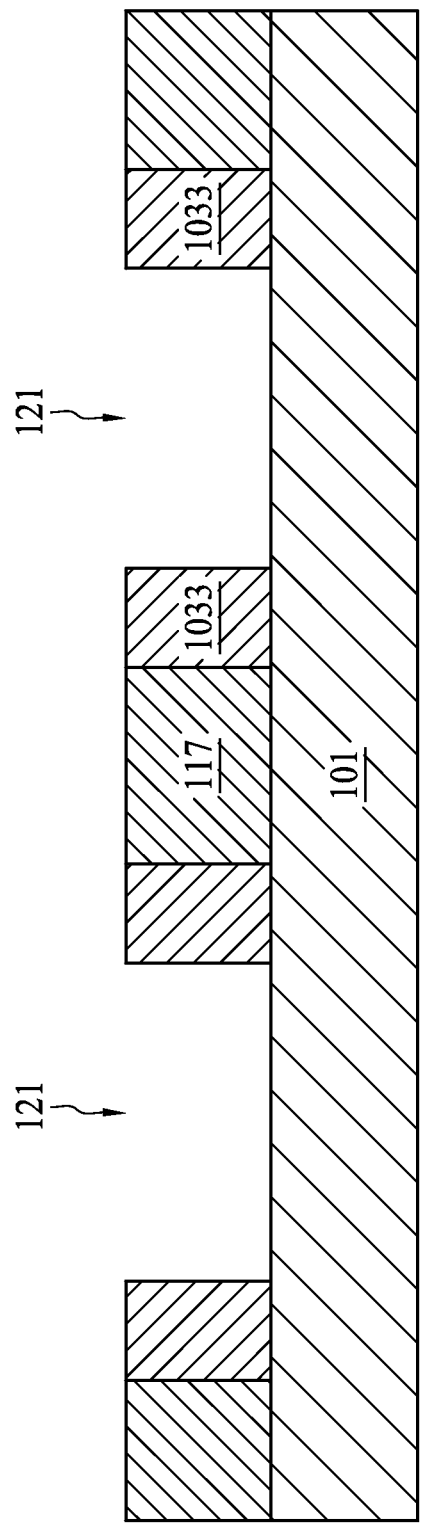

In FIG. 9, a first interlayer dielectric layer (ILD) 117 is then deposited onto the sidewall spacer layer 1033' by a dielectric deposition technique well know in the art. A local and/or global planarization may be accomplished using processes such as SOG etchback or polishing. In one embodiment of the present invention the interlayer dielectric is planarized using chemical mechanical polishing. As shown in FIG. 9, after the planarization operation, the replacement gate, the sidewall spacer 1033, and the first RDL 117 share a substantial coplanar top surface. In FIG. 10, the replacement gate 120 is removed by a suitable etching operation to remove the sacrificial materials filling a metal gate trench 121.

Figure 11:
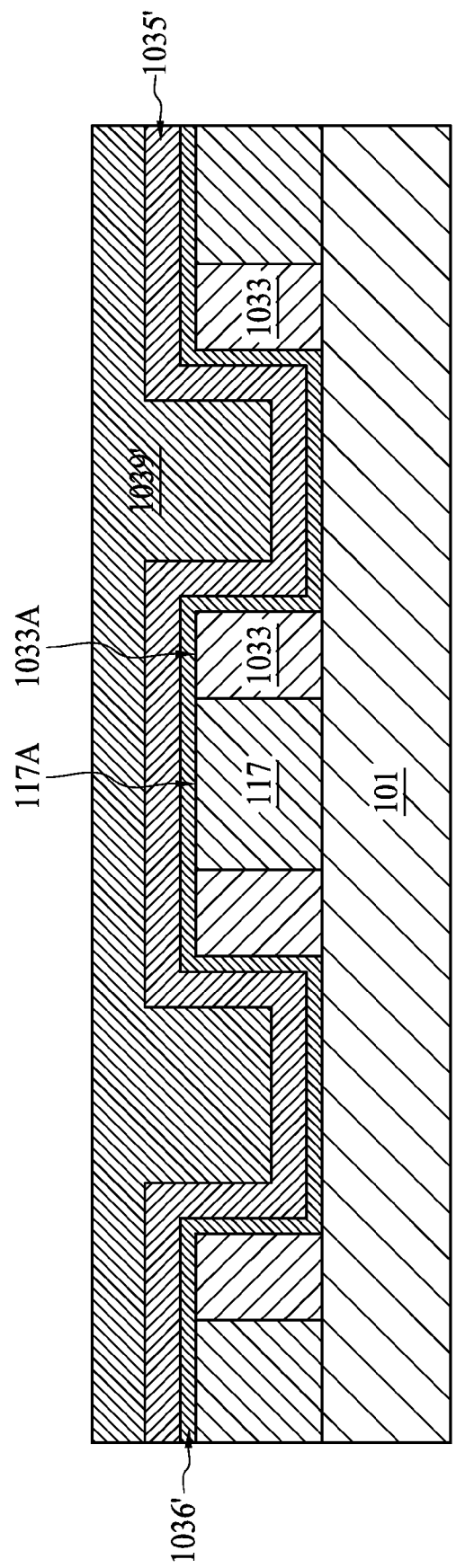
Figure 12:
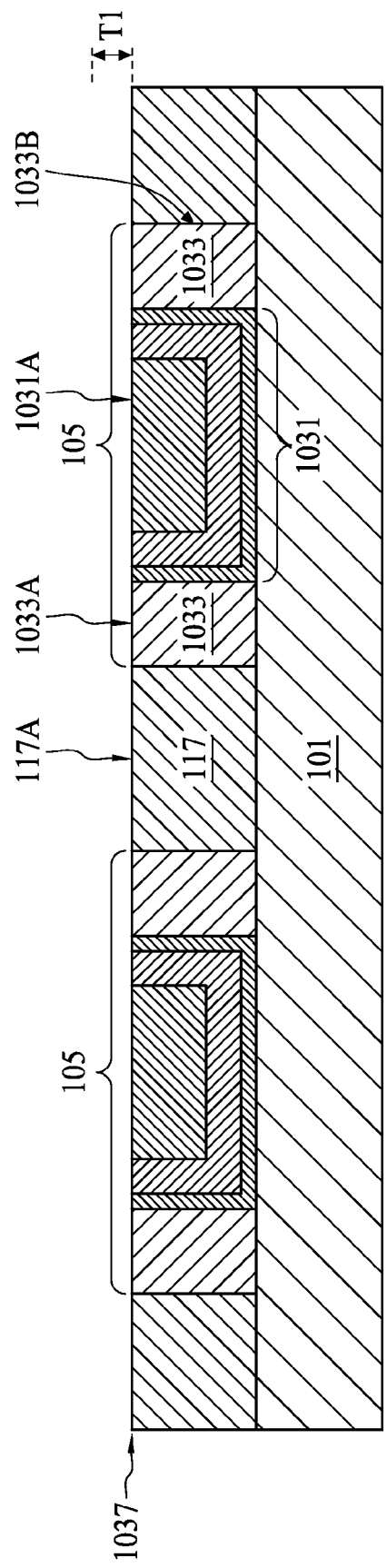

FIG. 11 shows subsequent formation of conductive materials in the metal gate trench 121. A gate dielectric layer 1036' and a work function metal layer 1035' are conformally deposited over the metal gate trench 121 and the features such as sidewall spacers 1033 and first ILD 117. A gate-fill metal layer 1039' is subsequently formed on the work function metal layer 1035' and fills the metal gate trench 121. In FIG. 12, a planarization operation is performed to remove excessive gate-fill metal layer 1039', as well as to remove the work function metal layer 1035' and the gate dielectric layer 1036' disposed on the top surface 1033A of the sidewall spacer 1033 and the top surface 117A of the first ILD 117. Referring to FIG. 12, a substantial level top surface 1037 can be identified in the semiconductor structure. The substantial level top surface 1037 includes the top surface 1031A of a conductive portion 1031 of the metal gates 105, the top surface 1033A of the sidewall spacer 1033, and the top surface 117A of the first ILD 117. The first ILD 117 can be seen to surround an outer surface 1033B of the sidewall spacer 1033.

Figure 13:
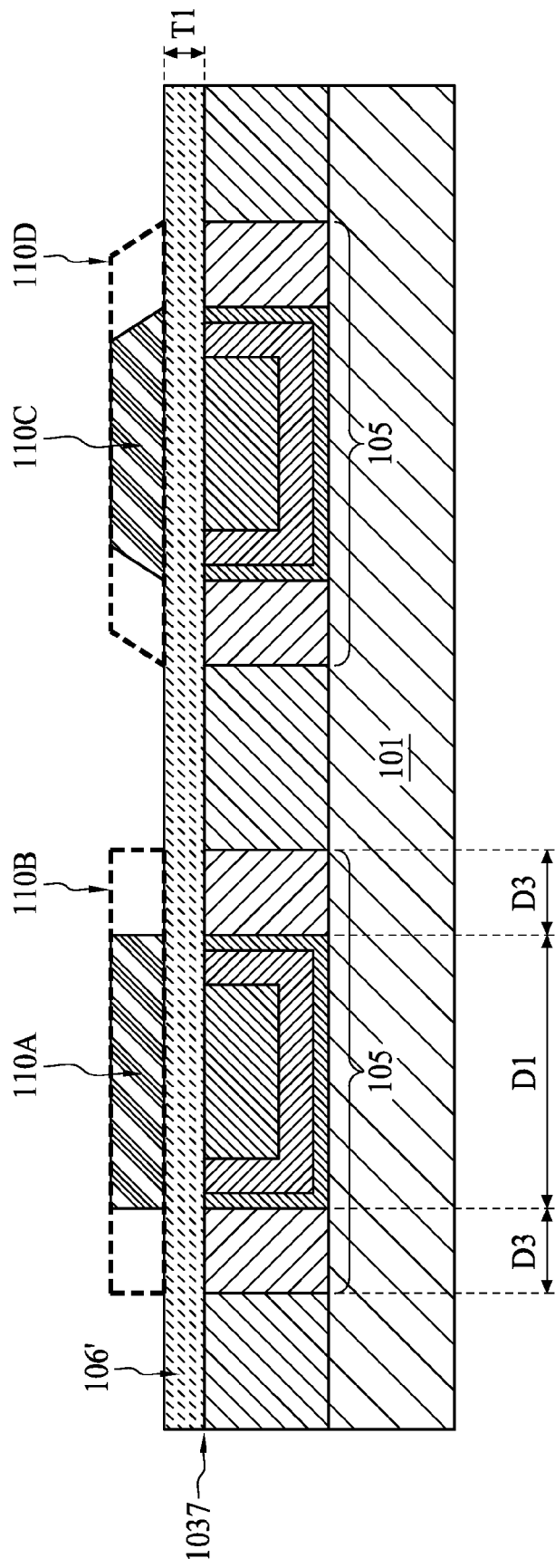
FIG. 13 to FIG. 14 are operations in a semiconductor structure manufacturing method of forming a protection layer over a metal gate structure in accordance with some embodiments of the present disclosure.
Figure 14:
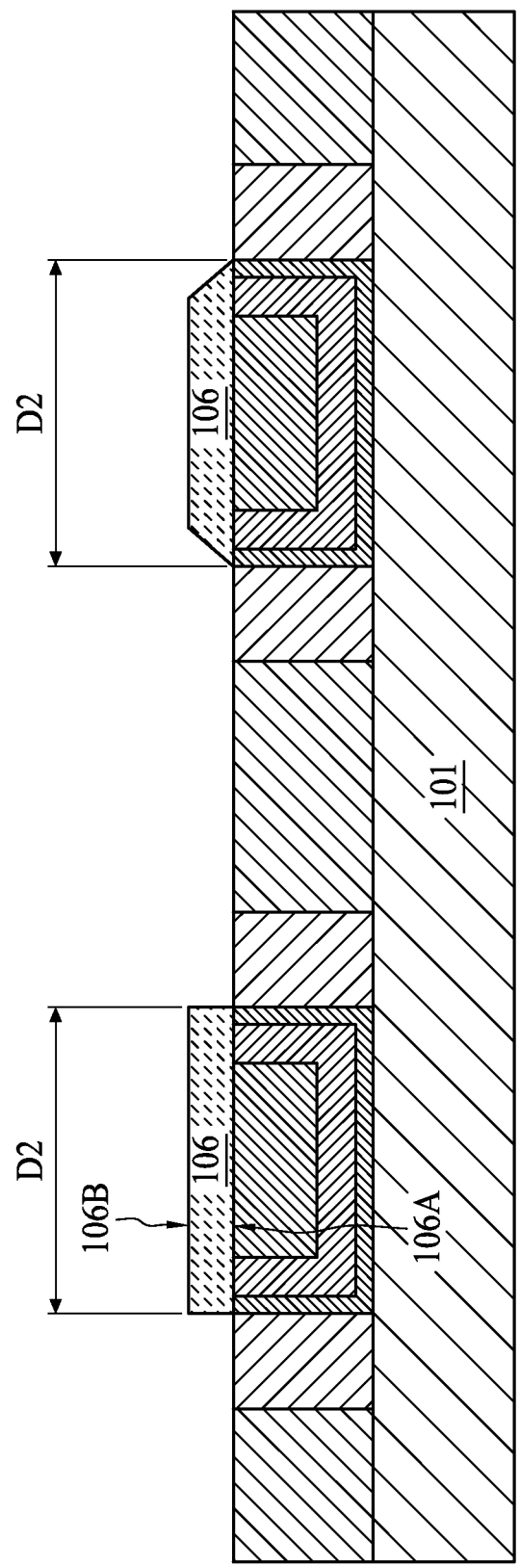

FIG. 13 to FIG. 14 show the operations of forming a protection layer over the metal gate structure 105. In some embodiments, the protection layer width D2 is at least equal to or greater than the conductive portion width D1 of the metal gate 105. As shown in FIG. 13, a protection layer 106' is blanket deposited over the substantial level top surface 1037. In some embodiments, a thickness T1 of the protection layer 106' is in a range of from about 5 Å to about 5000 Å. In some embodiments, the formation of the protection layer 106' includes depositing sulfur nitride, silicon nitride, silicon oxynitride, or a silicon carbonitride by a chemical vapor deposition (CVD) or a physical vapor deposition (PVD) operation.

In FIG. 13, a patterned hard mask (110A, 110B, 110C, 110D) is formed over the protection layer 106' by any suitable process. The hard mask (110A, 110B, 110C, 110D) includes any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material. The lateral dimension and the shape of the hard mask can be categorized into the following groups. In some embodiments, the hard mask 110A has a vertical sidewall and a width equal to the conductive portion width D1, but smaller than the total width (D1+2D3) of the metal gate 105. In some embodiments, the hard mask 110B also has a vertical sidewall and a width greater than the conductive portion width D1, but equal to the total width (D1+2D3) of the metal gate 105. In some embodiments, the hard mask 110C has a tapered sidewall and a width equal to the conductive portion width D1, but smaller than the total width (D1+2D3) of the metal gate 105. In some embodiments, the hard mask 110D also has a tapered sidewall and a width greater than the total width (D1+2D3) of the metal gate 105.

FIG. 14 shows the exemplary results of the removal of the protection layer 106' not covered by the hard mask (110A, 110C). A suitable etch operation can be used to remove an uncovered portion of the blanket deposited protection layer 106' materials and transfer the hard mask pattern to the final protection layer 106. In some embodiments, the protection layer width D2 in the protection layer 106 having a vertical sidewall is the distance measured from one vertical sidewall to the opposite vertical sidewall. In other embodiments, the protection layer width D2 in the protection layer 106 having a tapered sidewall is the distance measured from the two bottom ends of the tapered sidewall.

Figure 15A:
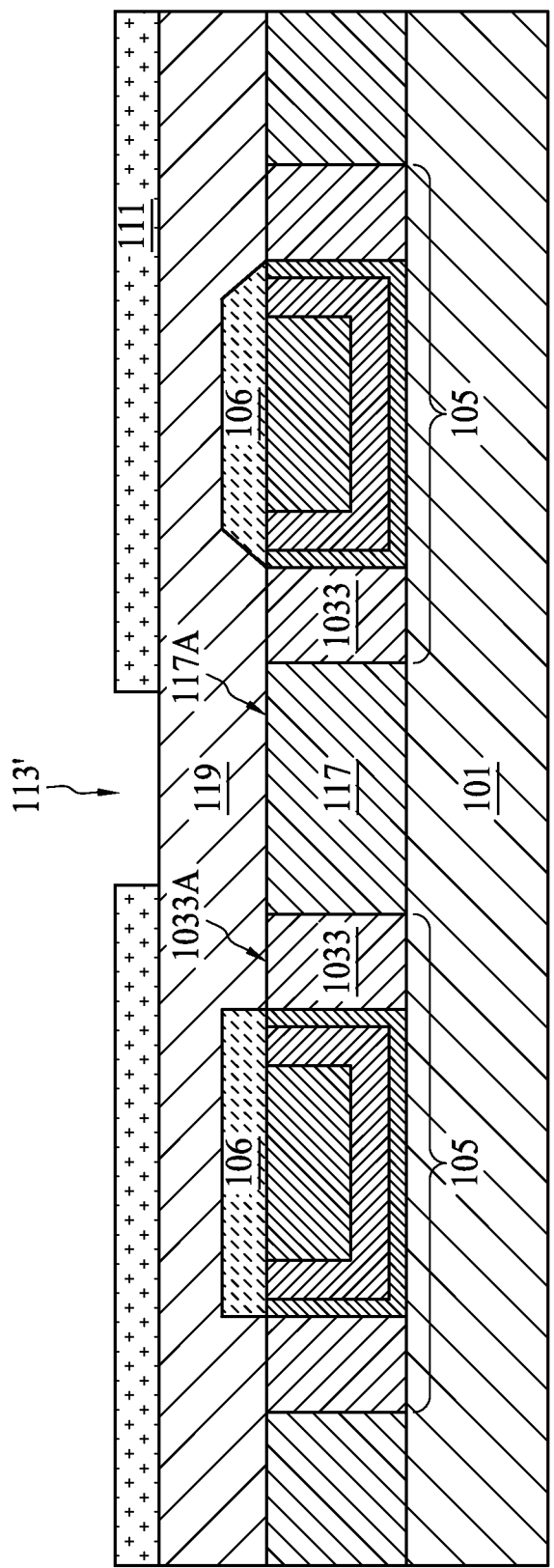
FIG. 15A to FIG. 17B are operations in a semiconductor structure manufacturing method of forming a conductive plug in a metal gate structure in accordance with some embodiments of the present disclosure.

FIG. 15A to FIG. 17B show the formation of a second ILD 119 and the formation of the conducive plug (109, 109') in a semiconductor structure described in the present disclosure. FIGS. 15A, 16A, 17A delineate a perfect alignment of the mask 111 having conductive plug pattern 113, whereas 15B, 16B, 17B delineate a misalignment of the mask 111 having conductive plug pattern 113. In some embodiments, the alignment operation of the mask 111 having conductive plug pattern 113 is performed manually, and hence the misalignment of the mask 111 occurred frequently.

Figure 15B:
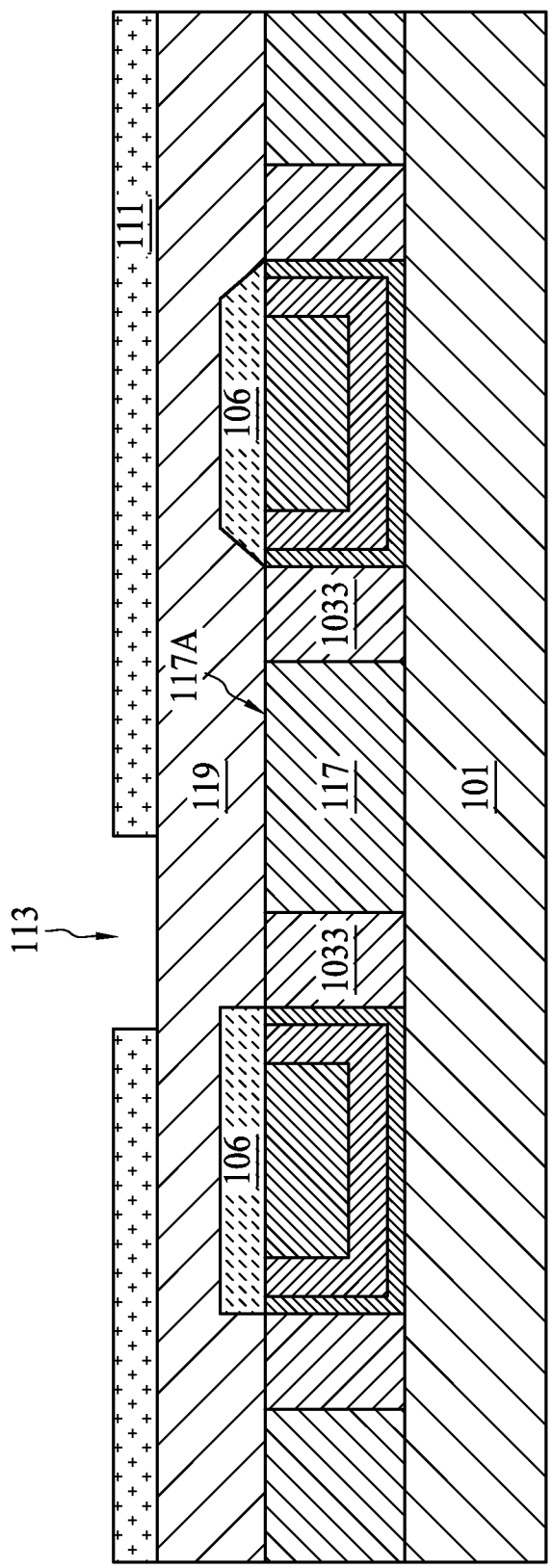

As shown in FIG. 15A and FIG. 15B, a second ILD 119 is formed over the protection layer 106, the top surface 1033A of the sidewall spacer 1033, and the top surface 117A of the first ILD 117. The thickness of the second ILD 119 shall at least greater than the thickness of the protection layer 106. The materials made of second ILD 119 can be of the same materials made of the first ILD 117. The suitable materials to use are previously described and can be referred to the description in FIG. 3 of the present disclosure. As can be seen in FIG. 15A and FIG. 15B, the mask 111 having a conductive plug pattern (113', 113) is positioned over the second ILD 119. In FIG. 15A, opening in the conductive plug pattern 113' is disposed between two adjacent metal gates 105, whereas in FIG. 15B, the opening in the conductive plug pattern 113 is disposed in a position overlaying the protection layer 106 and the sidewall spacer 1033 of the left metal gate 105.

Figure 16A:
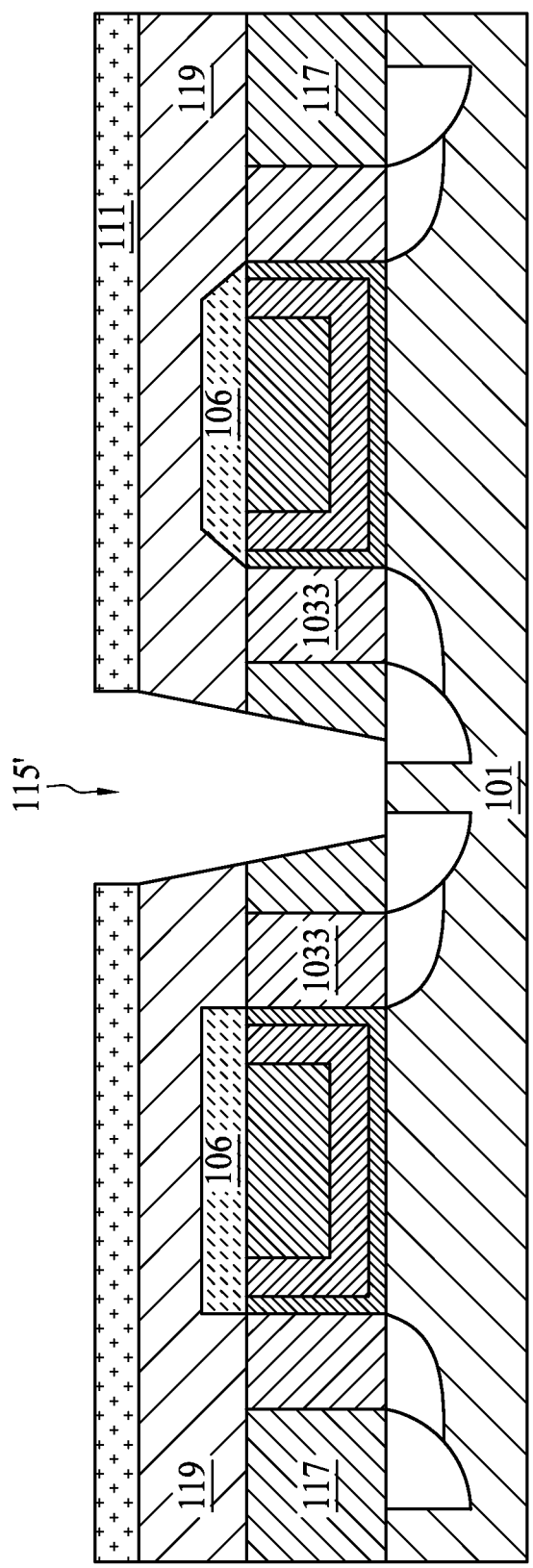
Figure 16B:
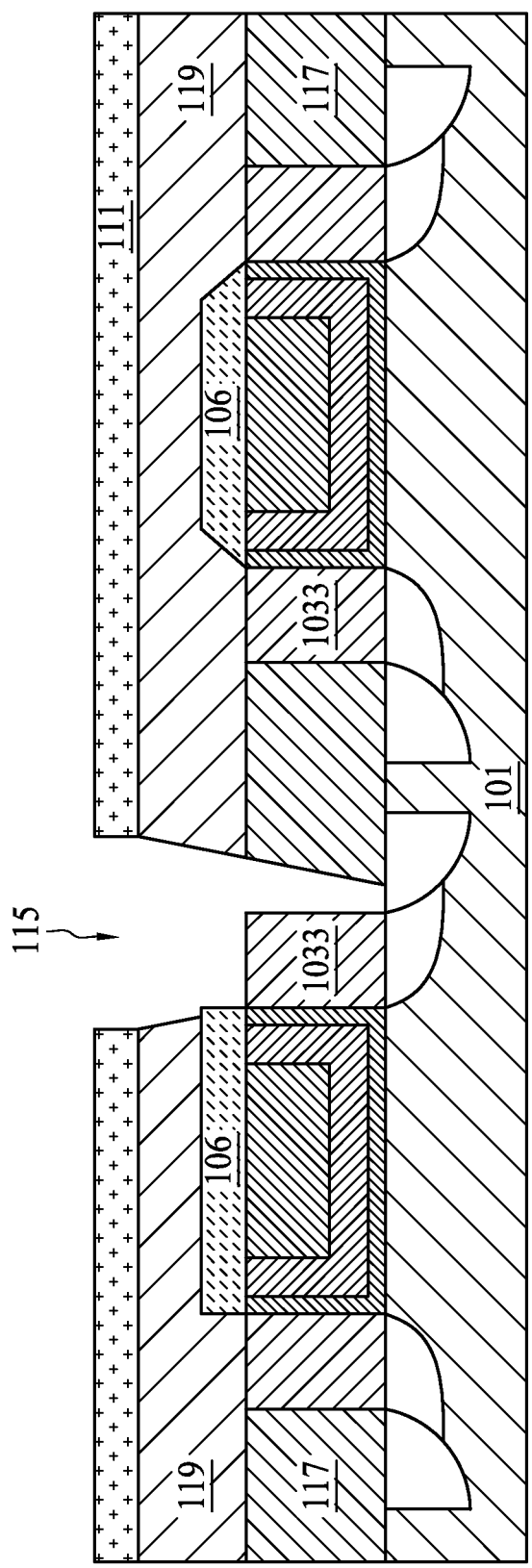

In FIG. 16A and FIG. 16B, a hole (115', 115) is formed in the first ILD 117 and the second ILD 119 by conducting a fluoride-based wet etch, dry etch, or the combination thereof. In FIG. 16A, any of the above-mentioned etch operation stops at the surface of the semiconductor layer 101, and hence the hole 115' has a bottom showing the surface of the semiconductor layer 101. In FIG. 16B, any of the above-mentioned etch operation stops at the sidewall spacer 1033, the protection layer 106, and the surface of the semiconductor layer 101. In some embodiments, the fluoride-based etchants etch an oxide-based ILD material in a rate substantially faster than the rate the fluoride-based etchant etches a nitride-based material. The nitride-based material includes the protection layer 106 or the sidewall spacer 1033 exemplified in the present disclosure. For example, the etch rate between the oxide-based materials and the nitride-based materials is in a range of from 10:1 to about 100:1. However, the materials made of the ILDs (117, 119) and the materials made of the protection layer 106 do not have to be oxide-based and nitride-based, respectively. The etchant used to selectively etch the ILDs (117, 119) and the protection layer 106 does not have to be fluoride-based. Any materials showing an etch selectivity greater than 10:1 to a predetermined etchant is within the contemplating scope of the present disclosure as being the ILDs (117, 119) and the corresponding protection layer 106.

Figure 17A:
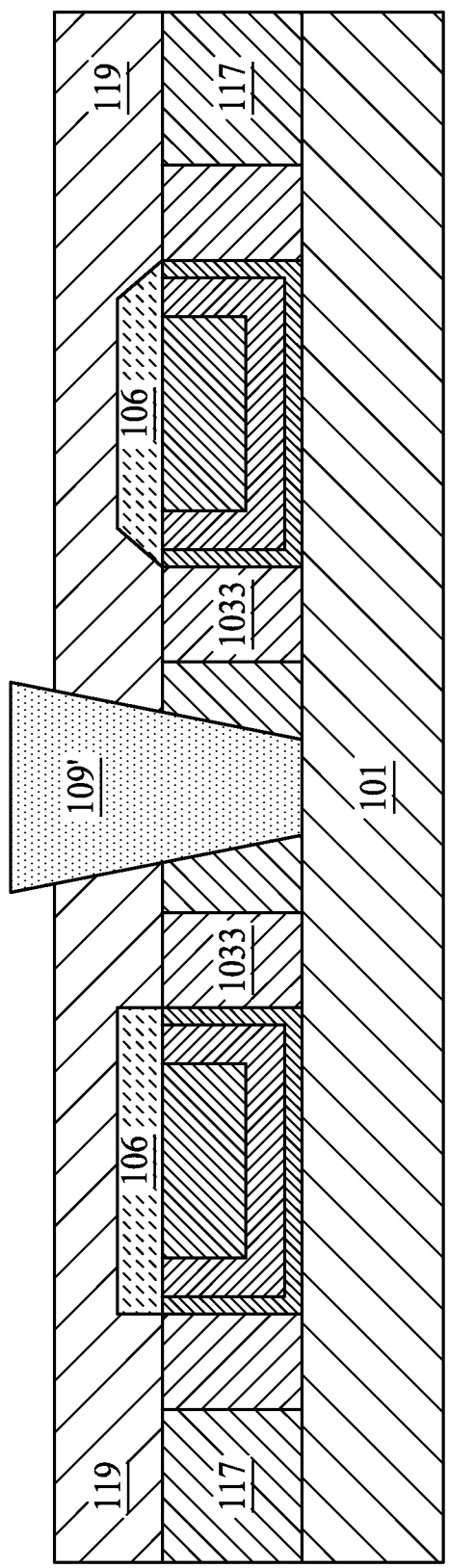
Figure 17B:
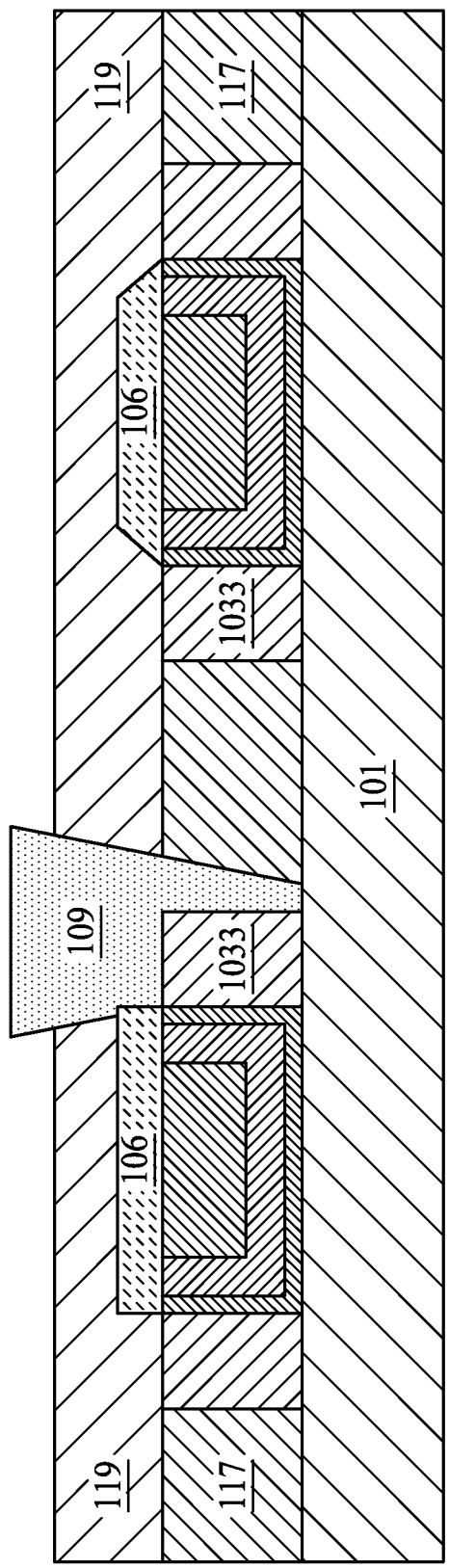

In FIG. 17A and FIG. 17B, a conductive plug (109', 109) is formed inside the hole (115', 115) situated in the first ILD 117 and the second ILD 119. The conductive plug (109', 109) is made of copper, tungsten, silicide, or the combination thereof. In some embodiments, the hole (115', 115) is filled with tungsten by a CVD process with a good gap-fill capability. In other embodiments, the hole (115', 115) is filled by a blanket tungsten CVD process with a titanium/titanium nitride barrier or glue layer formed prior to the nucleation of a tungsten seed layer and a bulk tungsten formation.

Some embodiments of the present disclosure provide a semiconductor structure. The semiconductor structure includes a semiconductor layer; a gate h having a conductive portion and a sidewall spacer, and the gate is positioned over the semiconductor layer; an interlayer dielectric (ILD) surrounding the sidewall spacer of the gate, positioning over the semiconductor layer; and a nitrogen-containing protection layer, positioning at least on the top surface of the conductive portion of the gate. A top surface of the conductive portion and a top surface of the sidewall spacer are substantially coplanar. The nitrogen-containing protection layer is not covering the sidewall surface of the sidewall spacer.

In some embodiments, the protection layer includes at least one of sulfur nitride, silicon nitride, silicon oxynitride, silicon carbonitride, and the combination thereof.

In some embodiments, the protection layer is positioned on the top surface of the conductive portion and the top surface of the sidewall spacer.

In some embodiments, the protection layer is laterally protruding from the top surface of the conductive portion and the top surface of the sidewall spacer, and the protruding portion of the protection layer is supported by the ILD.

In some embodiments, the protection layer and the sidewall spacer are made of same materials.

In some embodiments, the protection layer includes a first surface contacting the top surface of the conductive portion and the top surface of the sidewall spacer, and a second surface opposite to the first surface, and wherein a length of the second surface is shorter than a length of the first surface.

In some embodiments, the semiconductor layer is a fin structure in a FinFET.

In some embodiments, the top surface of the conductive portion is a substantial level plane.

Some embodiments of the present disclosure provide a semiconductor FinFET structure. The semiconductor FinFET structure includes a semiconductor fin; a plurality of metal gates over the semiconductor fin; an interlayer dielectric (ILD) surrounding the plurality of metal gates, positioning over the semiconductor fin; and a nitrogen-containing protection layer over one of the plurality of metal gates. A total width of one of the plurality of metal gates includes a conductive portion width and a sidewall spacer width. A width of the protection layer is greater than the conductive portion width of the plurality of metal gates, and a top surface of a conductive portion constituting the conductive portion width and a top surface of the sidewall spacer constituting the sidewall spacer width are substantially coplanar.

In some embodiments, the semiconductor FinFET structure further includes a metal gate space width equals to a distance between two adjacent metal gates, and the width of the protection layer is smaller than a sum of the conductive portion width, two times the sidewall spacer width, and a metal gate space width.

In some embodiments, a thickness of the protection layer in the semiconductor FinFET structure is in a range of from about 5 Å to about 5000 Å.

In some embodiments, the conductive portion widths of one of the plurality of metal gates are different in at least two metal gates.

In some embodiments, the protection layer in the semiconductor FinFET structure includes a tapered or a vertical sidewall.

Some embodiments of the present disclosure provide a method for manufacturing a semiconductor structure. The method includes forming a metal gate structure with a level top surface on a semiconductor layer, and the metal gate structure including a conductive portion and a sidewall spacer is surrounded by a first interlayer dielectric (ILD); forming a protection layer over the metal gate structure, and the protection layer is formed to cover at least the conductive portion of the metal gate structure; forming a second ILD over the metal gate structure; and forming a conductive plug between two adjacent metal gate structures, and the conductive plug is over the semiconductor layer.

In some embodiments, the forming the protection layer over the metal gate structure in the method for manufacturing the semiconductor structure includes depositing a protection layer over the level top surface of the metal gate structure; patterning a hard mask over the protection layer; and removing a portion of the protection layer not covered by the hard mask.

In some embodiments, the depositing the protection layer over the level top surface of the metal gate structure in the method for manufacturing the semiconductor structure includes forming a nitride, an oxynitride, or a carbonitride protection layer having a thickness of from about 5 Å to about 5000 Å.

In some embodiments, the patterning the hard mask over the protection layer in the method for manufacturing the semiconductor structure includes forming a hard mask having a width greater than, equal to, or smaller than a width of the metal gate structure.

In some embodiments, the forming the conductive plug between two adjacent metal gate structures in the method for manufacturing the semiconductor structure includes forming a mask including a conductive plug pattern over the second ILD; forming a hole penetrating the first and the second ILD; and filling conductive materials in the hole. The semiconductor layer is exposed at a bottom of the hole.

In some embodiments, the method for manufacturing the semiconductor structure further includes manually aligning the mask between two adjacent metal gate structures.

In some embodiments, the forming a hole penetrating the first and the second ILD includes applying a fluoride-based dry etch or a fluoride-based wet etch.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the disclosure.

What is claimed is:

1. A semiconductor structure, comprising:
a semiconductor layer;
a plurality of gates, each comprising a conductive portion and a sidewall spacer, wherein a top surface of the conductive portion and a top surface of the sidewall spacer are substantially coplanar, and the plurality of gates are positioned over the semiconductor layer;
an interlayer dielectric (ILD) surrounding a sidewall surface of the sidewall spacer, positioning over the semiconductor layer;
a first nitrogen-containing protection layer, positioning at least on the top surface of the conductive portion of one of the gates, the first nitrogen-containing protection layer comprising a substantially vertical sidewall at one of the gates;
a second nitrogen-containing protection layer, positioning at least on the top surface of the conductive portion of another one of the gates, the second nitrogen-containing protection layer comprising a tapered sidewall at another one of the gates; and
a conductive plug simultaneously in contact with the sidewall surface and the top surface of the sidewall spacer;
wherein a full width of the first nitrogen-containing protection layer and a full width of the second nitrogen-containing protection layer are substantially equal to a full width of the conductive portion of each of the gates.

2. The semiconductor structure in claim 1, wherein each of the first nitrogen-containing protection layer and the second nitrogen-containing protection layer comprises at least one of sulfur nitride, silicon nitride, silicon oxynitride, silicon carbonitride, or combinations thereof.

3. The semiconductor structure in claim 1, wherein the first nitrogen-containing protection layer, the second nitrogen-containing protection layer and the sidewall spacer are made of same materials.

4. The semiconductor structure in claim 1, wherein the semiconductor layer is a fin structure in a FinFET.

5. The semiconductor structure in claim 1, wherein the top surface of the conductive portion is a substantial level plane.

* * * * *